United States Patent
Harayama

(10) Patent No.: US 10,811,246 B2
(45) Date of Patent: Oct. 20, 2020

(54) FORMING METHOD, FORMING SYSTEM, AND FORMING APPARATUS

(71) Applicant: MIMAKI ENGINEERING CO., LTD., Nagano (JP)

(72) Inventor: Kenji Harayama, Nagano (JP)

(73) Assignee: MIMAKI ENGINEERING CO., LTD., Nagano (JP)

( * ) Notice: Subject to any disclaimer, the term of this patent is extended or adjusted under 35 U.S.C. 154(b) by 216 days.

(21) Appl. No.: 15/659,079

(22) Filed: Jul. 25, 2017

(65) Prior Publication Data

US 2018/0036951 A1 Feb. 8, 2018

(30) Foreign Application Priority Data

Aug. 8, 2016 (JP) .................................. 2016-155709

(51) Int. Cl.
*H01L 21/02* (2006.01)
*B29C 64/236* (2017.01)
(Continued)

(52) U.S. Cl.
CPC .......... *H01L 21/02041* (2013.01); *B08B 3/10* (2013.01); *B29C 64/236* (2017.08);
(Continued)

(58) Field of Classification Search
CPC .............................. B29C 64/165; B33Y 50/02
See application file for complete search history.

(56) References Cited

U.S. PATENT DOCUMENTS 5,121,329 A * 6/1992 Crump .................... B22F 3/115
700/119
2002/0167101 A1 11/2002 Takata
(Continued)

FOREIGN PATENT DOCUMENTS

JP 2015-44299 3/2015
JP 2016-107406 6/2016
(Continued)

OTHER PUBLICATIONS

Extended European Search Report dated Dec. 21, 2017 issued in the corresponding European patent application No. 17184096.0.
(Continued)

*Primary Examiner* — Galen H Hauth
(74) *Attorney, Agent, or Firm* — Rankin, Hill & Clark LLP

(57) ABSTRACT

A forming method for forming a three-dimensional object includes a generating step including, based on model data representing the object, generating cross-section data respectively representing cross-sections of the object that are different in position in a cross-section arrangement direction. An executing step includes discharging build materials respectively based on the cross-section data. When at least a portion of the object is to be colored: the cross-section data include colored region data respectively representing cross-sections of a colored region of the object that is to be colored based on a color of a surface of the object; the executing step includes forming the colored region using the build materials based on the colored region data; the model data represents the color of the surface of the object in a multi-level gradation; and each of the colored region data represents a color in a lower level of gradation.

20 Claims, 7 Drawing Sheets

(51) Int. Cl.
*B08B 3/10* (2006.01)
*H01L 21/67* (2006.01)
*H01L 21/687* (2006.01)
*B33Y 30/00* (2015.01)
*B33Y 50/02* (2015.01)
*B41J 2/01* (2006.01)

(52) U.S. Cl.
CPC .. *H01L 21/02052* (2013.01); *H01L 21/67051* (2013.01); *H01L 21/68764* (2013.01); *B29K 2995/0021* (2013.01); *B33Y 30/00* (2014.12); *B33Y 50/02* (2014.12); *B41J 2/01* (2013.01)

(56) References Cited

U.S. PATENT DOCUMENTS

| | | | | |
|---|---|---|---|---|
| 2013/0194334 A1* | 8/2013 | Watanabe | ............. | B41J 2/2117 347/12 |
| 2016/0151975 A1 | 6/2016 | Nagahari | | |
| 2016/0151979 A1* | 6/2016 | Urban | ................... | B33Y 50/00 264/308 |
| 2016/0151980 A1 | 6/2016 | Hatanaka | | |
| 2016/0243761 A1* | 8/2016 | Okamoto | ............. | B29C 64/386 |
| 2016/0339643 A1 | 11/2016 | Shtilerman | | |
| 2017/0252979 A1 | 9/2017 | Donovan | | |

FOREIGN PATENT DOCUMENTS

| | | |
|---|---|---|
| WO | 2015111059 A1 | 7/2015 |
| WO | 2016057031 A1 | 4/2016 |

OTHER PUBLICATIONS

Japanese Office Action (JPOA) dated Sep. 24, 2019 issued in the corresponding Japanese patent application No. 2016-155709 and its English translation.

* cited by examiner

FORMING METHOD, FORMING SYSTEM, AND FORMING APPARATUS

CROSS-REFERENCE TO RELATED APPLICATIONS

The present application claims priority under 35 U.S.C. § 119 to Japanese Patent Application No. 2016-155709, filed Aug. 8, 2016. The contents of this application are incorporated herein by reference in their entirety.

BACKGROUND

Field of the Invention

The present disclosure relates to a forming method, a forming system, and a forming apparatus.

Discussion of the Background

JP2015-71282A1 discloses a forming apparatus (three-dimensional (3D) printer) that forms an object using an ink-jet head. In forming the object, the 3D printer utilizes additive manufacturing technology, which involves building up a plurality of layers of ink dispensed from the ink-jet head.

Another recent trend is to use a coloring ink as build material so as to form a colored object. For example, the coloring ink forms a colored region on the outer surface of the object, so that the object has a colored outer surface.

The contents of JP2015-71282A1 are incorporated herein by reference in their entirety.

When a colored object is formed, if the colored region has too small a thickness in a normal direction perpendicular to the outer surface of the object, the color(s) under the outer surface of the object may be easily exposed if there is a cut or other damage on the outer surface of the object. The color(s) under the outer surface of the object may also be easily exposed if there is an error in the hitting position of the ink, which also may cause color slurring problems. In light of these circumstances, when a colored object is formed, the colored region is preferably formed to some degree of thickness.

For a high quality colored object to be formed in a more appropriate manner, the object needs to be represented in, for example, a wide variety of colors such as half-tone variations of the coloring ink. This may necessitate half-toning or similar processing with respect to the color(s) used in model data representing the object so as to reduce color gradients. Thus, in order to form a high quality object in a more appropriate manner, it is necessary to perform half-toning or similar processing in a manner more suitable for the forming operation. In light of the above circumstances, it is an object of the present disclosure to provide an improved forming method, an improved forming system, and an improved forming apparatus.

The inventor conducted research and study on methods of representing colors including half-tone variations with a configuration more suitable for the forming operation. One exemplary method widely used in ink-jet printers to print two-dimensional images is half-toning such as dithering and error diffusion. However, the simplistic application of these half-toning methods to the forming operation may not necessarily result in appropriate representation of colors including half-tone variations.

To described this in more detail, dithering and error diffusion are methods used in two-dimensional printing to process pixels of a two-dimensional image. If dithering and/or error diffusion were applied to an object having a colored outer surface in a manner similar to two-dimensional printing, dithering and/or error diffusion would involve defining a plane on the outer surface of the object and processing at positions within the plane.

However, an object takes various shapes as opposed to the flatness of a sheet of paper and other medium in two-dimensional printing. Applying dithering and/or error diffusion to process positions within a plane defined on the outer surface of the object may result in complicated processing.

In light of the above circumstances, the inventor conceived of a more suitable forming method, and the method involves applying dithering and/or error diffusion to cross-sections of an object. As used herein, a cross-section of an object refers to a cross-section of each layer of a layered region (which is made up of layers of ink, for example) formed by successive addition in, for example, additive manufacturing. Applying dithering and/or error diffusion to cross-sections of an object makes use of characteristics of the forming operation, and this enables dithering and/or error diffusion to be used in a simpler and more appropriate manner.

The inventor also conducted research and study to find that error diffusion is a more suitable method for application to cross-sections of an object. To described this in more detail, when an object is formed by, for example, additive manufacturing, build material (for example, ink) is deposited on a layer-upon-layer basis, resulting in the object formed. In this respect, the layers constituting the object are formed based on data obtained by dithering or error diffusion.

When the data is obtained by dithering, the layers may be patterned reflecting a pattern of a mask (dither mask) used in dithering. When such layers are deposited upon each other in additive manufacturing, the patterns on the layers become more influential and may cause moire and similar phenomena. Thus, since the process of forming an object involves adding a plurality of layers upon each other, the dithering-caused patterns can be more influential than in two-dimensional printing. In this respect, it will be understood that the influence of the dithering-caused patterns can not be completely eliminated and may remain problematic even if the position of the pattern of the dither mask is shifted layer by layer.

In light of the above circumstances, the inventor conceived of a more specific and more suitable forming method, and the method involves applying error diffusion to cross-sections of an object. The inventor also has found that applying error diffusion ensures more appropriate representation of a wide variety of colors, including half-tone variations, in a manner more suitable for the forming operation. The inventor also conducted research and study to find features necessary to implement these effects, which lead to the present disclosure.

SUMMARY

According to one aspect of the present disclosure, a forming method for forming a three-dimensional object includes a cross-section data generating step and a formation executing step. The cross-section data generating step includes, based on model data representing the object to be formed, generating a plurality of pieces of cross-section data respectively representing cross-sections of the object to be formed that are different from each other in position in a predetermined cross-section arrangement direction in which the cross-sections are arranged. The formation executing step includes discharging build materials respectively based on the plurality of pieces of cross-section data so as to form the object. When at least a portion of the object is to be colored: the plurality of pieces of cross-section data generated in the cross-section data generating step include a plurality of pieces of colored region data respectively representing cross-sections of a colored region of the object that is to be colored based on a color of a surface of the object, each of the cross-sections of the colored region corresponding to the colored portion at least on a surface of each of the cross-sections of the colored region; the formation executing step includes forming the colored region using the build materials based on the colored region data, the build materials each including a coloring build material; the model data represents the color of the surface of the object in a multi-level gradation; and each of the plurality of pieces of colored region data generated in the cross-section data generating step represents a color in a lower level of gradation than the multi-level gradation of the color of the surface of the object represented in the model data. The lower level of gradation is obtained by reducing the multi-level gradation.

This configuration ensures more appropriate representation of a wide variety of colors, including half-tone variations, in a manner more suitable for the forming operation. This configuration also ensures that a high quality object is formed in a more appropriate manner.

In the above-described forming method, the object may be formed by additive manufacturing. A non-limiting example of each build material is an ultraviolet curable ink that is curable under ultraviolet light. A non-limiting example of each coloring material is an ink of any process color. The processing of reducing the level of gradation using error diffusion is quantization processing of reducing the level of gradation. A non-limiting example of the quantization processing is half-toning that involves binarizing the level of gradation.

A non-limiting example of the error diffusion processing includes distributing an error at least to a first portion of the colored region corresponding to one piece of cross-section data. In this case, it is preferable to distribute an error also to a second portion of the colored region corresponding to another piece of cross-section data that abuts the one piece of cross-section data in the cross-section arrangement direction. Also in the error diffusion, the range over which the error is distributed is preferably set based on a forming resolution. In this case, a first distribution ratio is preferably set that is based on a first forming resolution in the main scanning direction, a second distribution ratio of the error is preferably set that is set based on a second forming resolution in the sub-scanning direction, and a third distribution ratio of the error is preferably set that is set based on a third forming resolution in the deposition direction. Also in the error diffusion, the number of voxels (volumetric pixels) arranged in the range over which the error is distributed in the deposition direction, the number of voxels arranged in the range over which the error is distributed in the main scanning direction, and the number of voxels arranged in the range over which the error is distributed in the sub-scanning direction may be different from each other according to the forming resolution in each direction. In this case, the distance range over which the error is distributed is preferably uniform among the main scanning direction, the sub-scanning direction, and the deposition direction. As used herein, being uniform in distance refers to being approximately equal in distance with a degree of accuracy based on the forming resolution.

The above-described forming method may be considered as a method for producing an object. Otherwise, the present disclosure may be configured as a forming system and a forming apparatus each having features similar to the above-described features of the forming method. When the present disclosure is configured as a forming system and a forming apparatus, advantageous effects similar to the above-described advantageous effects of the forming method are provided.

The above-described embodiments of the present disclosure ensure that a high quality object is formed in a more appropriate manner.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
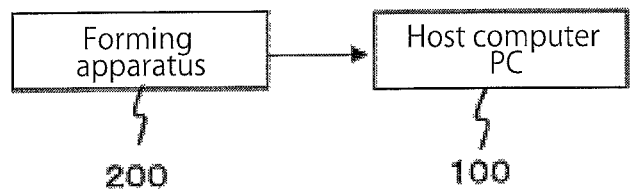
FIG. 1A illustrates an exemplary configuration of a forming system 10, which practices the forming method according to an embodiment of the present disclosure.
Figure 1B:
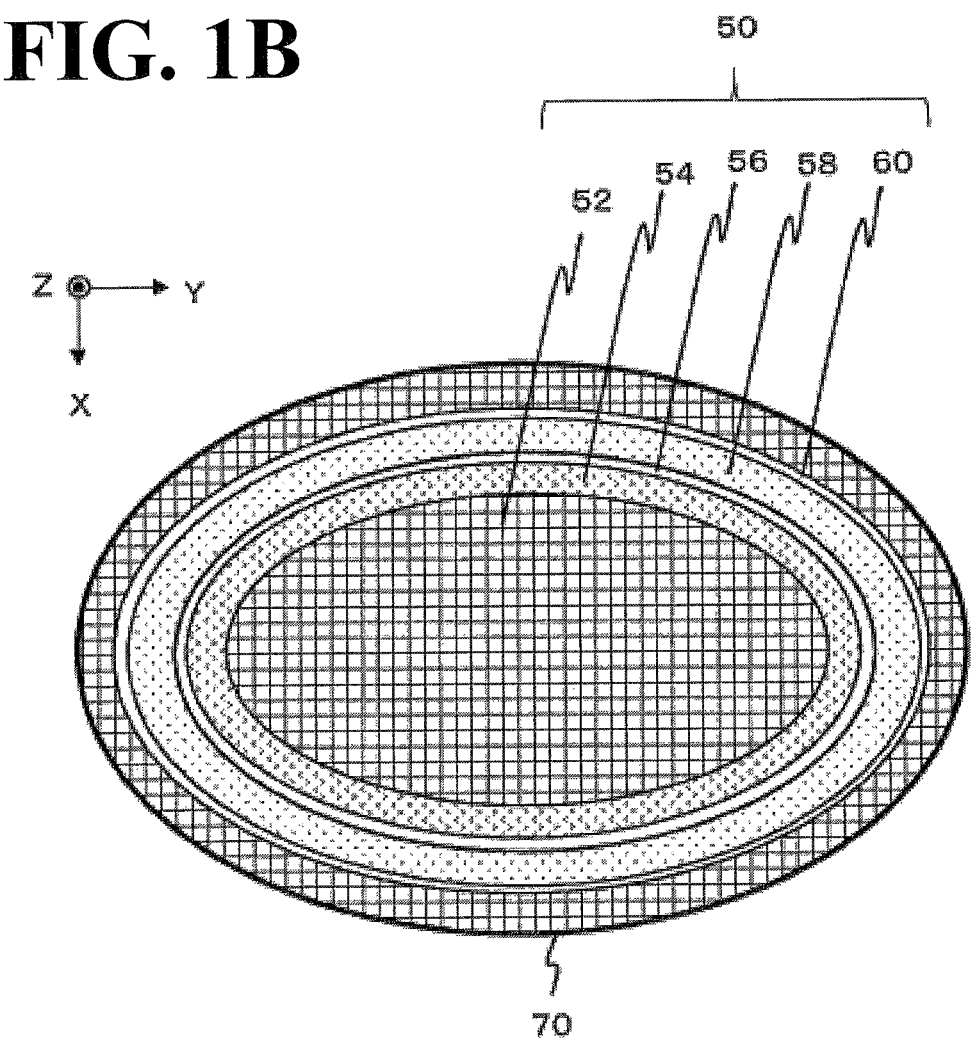
FIG. 1B is a cross-sectional view of an object 50, which is formed by a forming apparatus 100, and a cross-sectional view of a support layer 70.

The embodiments will now be described with reference to the accompanying drawings, wherein like reference numerals designate corresponding or identical elements throughout the various drawings. FIGS. 1A and 1B illustrate the forming system 10, which practices the forming method according to the embodiment of the present disclosure. FIG. 1A illustrates an exemplary configuration of the forming system 10.

In this embodiment, the forming system 10 is a system that forms a three-dimensional object, and includes the forming apparatus 100 and a host computer (PC) 200. The forming apparatus 100 is an apparatus that practices the forming operation. Also in this embodiment, the forming apparatus 100 forms an object by additive manufacturing. As used herein, additive manufacturing refers to a method by which an object is formed by adding a plurality of layers upon each other. Also as used herein, the object refers to a three-dimensional structure. The forming apparatus 100 uses, as build material, ink curable under a predetermined condition(s). A specific configuration and other features of the forming apparatus 100 will be described later.

The host PC 200 is a computer that controls the operation of the forming apparatus 100. In this embodiment, the host PC 200 is a non-limiting example of the cross-section data generator recited in the appended claims. Based on model data representing the object to be formed, the host PC 200 generates data adapted to the forming apparatus 100's forming operation. Then, the host PC 200 supplies the generated data to the forming apparatus 100 so as to cause the forming apparatus 100 to perform the forming operation. The data processing performed by the host PC 200 will be described in more detail later.

FIG. 1B is a cross-sectional view of the object 50, which is formed by the forming apparatus 100, and a cross-sectional view of the support layer 70. More specifically, FIG. 1B schematically illustrates a configuration of a cross-section of the object 50 along a plane perpendicular to deposition direction (Z direction). The deposition direction (Z direction) is a direction in which build materials are deposited in the additive manufacturing. In the illustrated embodiment, the object 50 is a three-dimensional ellipsoid. In this case, a cross-section of the object 50 along a plane perpendicular to either the X direction or the Y direction illustrated in FIG. 1B also has an identical or similar configuration to the configuration illustrated in FIG. 1B. More specifically, the object 50 according to this embodiment includes an inner region 52, a light-reflecting region 54, an inner clear region 56, a colored region 58, and a surface clear region 60. The regions of the object 50 are arranged in this order in the outward direction of the object 50.

The inner region 52 is a model layer that forms the shape of the object 50. In this embodiment, the inner region 52 is formed of a build material ink, which is an ink dedicated to forming. In another possible embodiment, the inner region 52 may be formed of an ink other than the build material ink. For example, the inner region 52 may be formed of any of various kinds of ink other than the material of the support layer 70. More specifically, the inner region 52 may be formed of coloring ink (color ink) or may be formed of white ink, clear ink, or other similar ink.

The light-reflecting region 54 is a reflecting layer that reflects light incident on the outer surface of the object 50 and passing through the colored region 58 and other elements. Forming the light-reflecting region 54 at a position inner than the colored region 58 ensures that coloring is performed in a more appropriate manner by subtractive mixing, for example. Also in this embodiment, the light-reflecting region 54 is formed of white (W color) ink.

The inner clear region 56 is a transparent region (transparent layer) defined between the light-reflecting region 54 and the colored region 58. Forming the inner clear region 56 appropriately prevents mixture of ink colors that otherwise may occur between the light-reflecting region 54 and the colored region 58. Also in this embodiment, the inner clear region 56 is formed of colorless (transparent, T color) clear ink.

The colored region 58 is a region (color layer) that is colored by coloring ink. Also in this embodiment, the colored region 58 is a layered region formed along the surface shape of the object 50 and is formed of clear ink and coloring inks of a plurality of colors. Examples of the coloring inks include, but are not limited to, cyan color (C color) ink, magenta color (M color) ink, yellow color (Y color) ink, and black color (K color) ink. These colors of ink are non-limiting examples of process colors of ink. These colors of ink, however, are not intended as limiting the coloring ink, and it is possible to additionally use any other colors of ink. A possible example is spot color (solid color) ink such as white ink.

Also in this embodiment, coloring inks of various colors are extruded in controlled amounts to positions on the colored region 58, so that a wide variety of colors are represented. This may cause a difference in amount (amount of extrusion per unit volume) between the coloring inks depending on which color to represent. In light of the circumstances, in this embodiment, clear ink is additionally used in the colored region 58 to compensate for the change in the amounts of the coloring inks caused by different colors to represent. This configuration ensures that positions on the colored region 58 are colored in a wide variety of colors in a more appropriate manner. This configuration also ensures that the colored region 58 colored in coloring inks are formed in a more appropriate manner.

The surface clear region 60 is a transparent region (transparent layer) that protects the outer surface of the object 50. Also in this embodiment, the surface clear region 60 is a region constituting the outermost surface of the object 50, and is formed of clear ink. Forming the surface clear region 60 ensures that the colored region 58 and other elements inner than the surface clear region 60 are protected in a more appropriate manner. This configuration also ensures that the object 50 colored on the outer surface is formed in a more appropriate manner.

In this embodiment illustrated in FIG. 1B, the support layer 70 is formed around the object 50, as necessary. The support layer 70 is a layer structure that surrounds the outer surface of the object 50 being formed so as to support the object 50. A non-limiting example of the support layer 70 is a layer formed of a water soluble material. This layer is formed, as necessary, during formation of the object 50 and removed after formation of the object 50 is completed.

It will be understood that the above-described configuration of the object 50 is not intended in a limiting sense, and any of other various configurations is possible. In another possible embodiment, the inner region 52 may be integral to the light-reflecting region 54, instead of being separate from the light-reflecting region 54. In this case, the inner region 52 and the light-reflecting region 54 may be integrally formed using light-reflecting ink such as white ink. In still another possible embodiment, one or some of the regions may be omitted depending on quality and/or other feature required of the object 50. For example, one or both of the inner clear region 56 and the surface clear region 60 may be omitted.

Figure 2A:
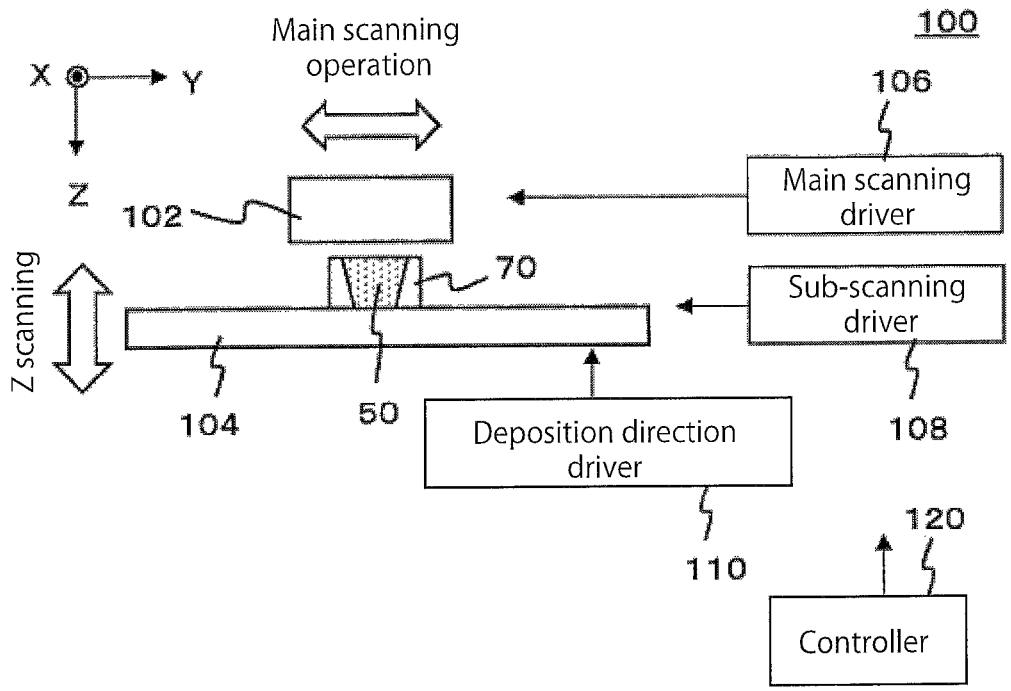
FIG. 2A illustrates an exemplary configuration of main elements of the forming apparatus 100.
Figure 2B:
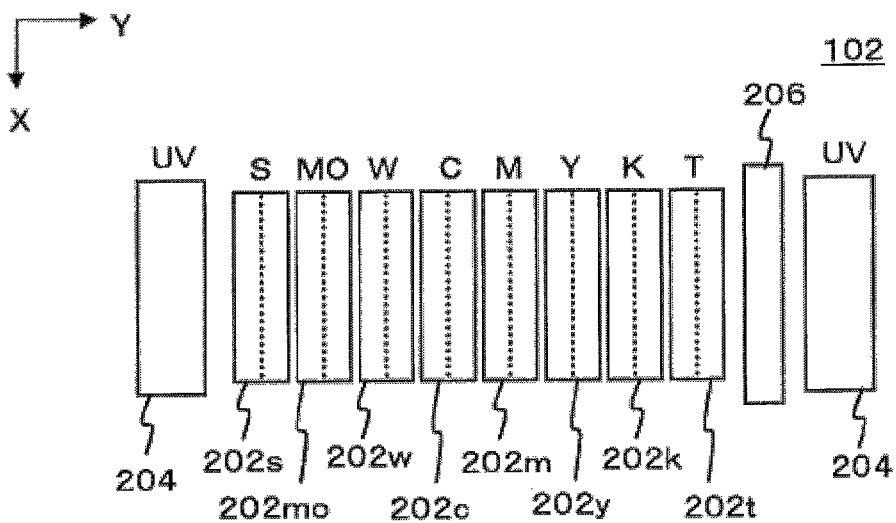
FIG. 2B illustrates a more detailed configuration of a head 102.

A specific configuration and other features of the forming apparatus 100 will be described. FIGS. 2A and 2B illustrate an example of the forming apparatus 100. FIG. 2A illustrates an exemplary configuration of main elements of the forming apparatus 100.

The forming apparatus 100X) is different from known forming apparatuses in the respects described below, and otherwise may be the same as or similar to known forming apparatuses. For example, except for the respects described below, the forming apparatus 100 may have a configuration that is the same as or similar to a known forming apparatus that forms an object using an ink-jet head that extrudes droplets of build material of the object. For further example, the forming apparatus 100 may have, in addition to the illustrated elements, any of various other elements necessary for formation, coloring, and other operations associated with the object 50.

In this embodiment, the forming apparatus 100 includes the head 102, a platform 104, a main scanning driver 106, a sub-scanning driver 108, a deposition direction driver 110, and a controller 120. The head 102 extrudes droplets of build material of the object 50. More specifically, the head 102 extrudes droplets of an ink curable under a predetermined condition(s) and causes the ink to cure. In this manner, the head 102 builds layers of the object 50. In this case, the ink refers to a liquid extruded from the ink-jet head. The term ink-jet head refers to an extrusion head that extrudes droplets of ink (ink droplet) by ink-jet method. Also in this embodiment, the head 102 includes a plurality of ink-jet heads and an ultraviolet (UV) light source. The head 102 also extrudes droplets of material of the support layer 70. A specific configuration of the head 102 will be described later.

The platform 104 is a pedestal-shaped member supporting the object 50 being formed, and is disposed at a position opposed to the ink-jet heads of the head 102. The object 50 being formed is placed on the upper surface of the platform 104. Also in this embodiment, at least the upper surface of the platform 104 is movable in the deposition direction. More specifically, as the formation of the object 50 progresses, the deposition direction driver 110 drives at least the upper surface of the platform 104 into movement in the deposition direction. As used herein, the deposition direction refers to a direction (Z direction illustrated in FIG. 2A) orthogonal to main scanning direction (Y direction illustrated in FIG. 2A) and sub-scanning direction (X direction illustrated in FIG. 2A). The main scanning direction and the sub-scanning direction are set in advance in the forming apparatus 100.

The main scanning driver 106 is a driver that causes the head 102 to perform main scanning operation (Y scanning). As used herein, causing the head 102 to perform the main scanning operation refers to causing the ink-jet heads of the head 102 to perform the main scanning operation. Also as used herein, the main scanning operation refers to an operation performed by the head 102 to extrude ink droplets while moving in the main scanning direction.

Also in this embodiment, the main scanning driver 106 causes the head 102 to perform the main scanning operation by causing the head 102 to move while keeping the position of the platform 104 fixed in the main scanning direction. The movement of the head 102 in the main scanning operation may be relative to the object 50. For example, in a possible modification of the forming apparatus 100, it may be the object 50 that moves, which can be implemented by causing the platform 104 to move while keeping the position of the head 102 fixed.

Also in the main scanning operation according to this embodiment, the main scanning driver 106 drives the UV light source of the head 102. More specifically, the main scanning driver 106 turns the UV light source on during the main scanning operation to cause the ink on the build surface (formed layer) of the object 50 to cure. The build surface of the object 50 refers to the last deposited layer of the object 50 that becomes the foundation upon which the next layer is formed by the head 102.

The sub-scanning driver 108 is a driver that causes the head 102 to perform sub-scanning operation (X scanning). As used herein, causing the head 102 to perform the sub-scanning operation refers to causing the ink-jet heads of the head 102 to perform the sub-scanning operation. Also as used herein, the sub-scanning operation refers to a movement of the head 102 in the sub-scanning direction, which is approximately orthogonal to the main scanning direction, relative to the platform 104. More specifically, the sub-scanning operation refers to a movement of the head 102 over a predetermined forwarding distance in the sub-scanning direction relative to the platform 104.

Also in this embodiment, the sub-scanning driver 108 causes the head 102 to perform the sub-scanning operation during the main scanning operation. More specifically, the sub-scanning driver 108 causes the head 102 to perform the sub-scanning operation by causing the platform 104 to move while keeping the position of the head 102 fixed in the sub-scanning direction. In another possible embodiment, the sub-scanning driver 108 may cause the head 102 to perform the sub-scanning operation by causing the head 102 to move while keeping the position of the platform 104 fixed in the sub-scanning direction.

The deposition direction driver 110 is a driver that causes at least one of the head 102 and the platform 104 to move in the deposition direction (Z direction). As used herein, causing the head 102 to move in the deposition direction refers to causing at least the ink-jet heads of the head 102 to move in the deposition direction. Also as used herein, causing the platform 104 to move in the deposition direction refers to causing at least the position of the upper surface of the platform 104 to move in the deposition direction. By causing at least one of the head 102 and the platform 104 to move in the deposition direction, the deposition direction driver 110 causes at least the ink-jet heads of the head 102 to perform deposition direction scanning (Z scanning). In the deposition direction scanning, at least the ink-jet heads of the head 102 are caused to move in the deposition direction relative to the object 50. In this manner, the deposition direction driver 110 adjusts the positions of the ink-jet heads in the deposition direction relative to the object 50 being formed.

More specifically, in this embodiment, the deposition direction driver 110 causes the platform 104 to move while keeping the position of the head 102 fixed in the deposition direction. Alternatively, the deposition direction driver 110 may cause the head 102 to move while keeping the position of the platform 104 fixed in the deposition direction.

A non-limiting example of the controller 120 is CPU of the forming apparatus 100. The controller 120 controls the elements of the forming apparatus 100 to control the forming apparatus 100's forming operation 50. The controller 120 preferably controls the elements of the forming apparatus 100 based on information associated with the object 50 to be formed such as shape information and color image information. More specifically, in this embodiment, the forming apparatus 100 forms the object 50 based on slice data received from the host PC 200 (see FIG. 1B). The slice data that the forming apparatus 100 receives will be described in more detail later in connection with the operation of the host PC 200. This embodiment enables the object 50 to be formed in a more appropriate manner.

A specific configuration of the head 102 will be described below. FIG. 2B illustrates a more detailed configuration of the head 102. In this embodiment, the head 102 includes a plurality of ink-jet heads 202$s$, 202$mo$, 202$w$, 202$c$, 202$m$, 202$y$, 202$k$, and 202$t$ (hereinafter referred to as ink-jet heads 202$s$ to 202$t$), a plurality of UV light sources 204, and a flattening roller 206.

The ink-jet heads 202$s$ to 202$t$ are non-limiting examples of the extrusion head recited in the appended claims, and extrude ink droplets by ink-jet technology. Also in this embodiment, the ink-jet heads 202$s$ to 202$t$ are ink-jet heads that extrude ink droplets of ultraviolet curable ink, and are aligned in the main scanning direction (Y direction) and disposed at a position in the sub-scanning direction (X direction) suitable for extruding purposes. As used herein, the ultraviolet curable ink refers to an ink that cures upon exposure to ultraviolet light. The ink-jet heads 202s to 202t may be any known ink-jet heads. The ink-jet heads 202s to 202t have an array of nozzles each disposed on the surface of the corresponding ink-jet head opposed to the platform 104. These nozzles are aligned in the sub-scanning direction. In this case, ink droplets are extruded through the nozzle of each ink-jet head in a direction toward the platform 104.

The arrangement of the ink-jet heads 202s to 202t will not be limited to the arrangement illustrated in FIG. 2B, and any of various other manners of arrangement is possible. For example, one or some of the ink-jet heads may be shifted in the sub-scanning direction relative to other ink-jet heads. The head 102 may also include an additional ink-jet head(s) for some other color(s). For example, the head 102 may include ink-jet heads for lighter variations of the above-described colors and/or ink-jet heads for R (red), G (green), B (blue), and orange.

The ink-jet head 202s extrudes ink droplets containing the material of the support layer 70. A non-limiting example of the material of the support layer 70 is a water soluble material that is soluble with water after the object 50 has been formed. Preferably, the material of the support layer 70 is less ultraviolet-curable and more dissolvable than the build material of the object 50. More specifically, the material of the support layer 70 may be any known material for support layer use.

The ink-jet head 202mo extrudes ink droplets of build material ink (model material MO) of a predetermined color. The ink-jet head 202w extrudes ink droplets of white (W) ink.

The plurality of ink-jet heads 202c, 202m, 202y, and 202k (hereinafter referred to as ink-jet heads 202c to 202k) extrude ink droplets of coloring inks of chromatic colors. More specifically, the ink-jet head 202c extrudes ink droplets of ultraviolet curable ink of C color, the ink-jet head 202m extrudes ink droplets of ultraviolet curable ink of M color, the ink-jet head 202y extrudes ink droplets of ultraviolet curable ink of Y color, and the ink-jet head 202k extrudes ink droplets of ultraviolet curable ink of K color. The ink-jet head 202t extrudes ink droplets of clear ink.

The plurality of UV light sources 204 are a configuration that causes the above-described inks to cure. More specifically, the plurality of UV light sources 204 generate ultraviolet light to cause ultraviolet curable ink to cure. A non-limiting example of the UV light source 204 is an ultraviolet light-emitting diode (UVLED). Other examples of the UV light source 204 include, but are not limited to, a metal halide lamp and a mercury lamp. Also in this embodiment, one UV light source 204 is disposed at one end of the head 102 in the main scanning direction and the other UV light source 204 is disposed at the other end of the head 102 in the main scanning direction. Thus, the plurality of UV light sources 204 are arranged to hold the array of ink-jet heads 202s to 202t between the plurality of UV light sources 204.

The flattening roller 206 is a non-limiting example of the flattener recited in the appended claims, and flattens the layers of ink formed during formation of the object 50. The flattening roller 206 is disposed between one UV light source 204 and the array of ink-jet heads. More specifically, the flattening roller 206 is aligned with the array of ink-jet heads in the main scanning direction and is disposed at a position in the sub-scanning direction suitable for flattening purposes relative to the array of ink-jet heads. In the main scanning operation, the flattening roller 206 moves (scans) while keeping in contact with the outermost layer of ink so as to remove part of the ink that is not cured yet. In this manner, the flattening roller 20 flattens the layer of ink (slice layer) and adjusts the layer of ink to a predetermined thickness. Using the flattening roller 206 enables each layer of ink deposited in additive manufacturing to be flattened to a predetermined thickness with improved accuracy. Thus, the thickness of each layer of ink is adjusted in a more appropriate manner. This configuration also ensures that the forming operation in additive manufacturing is performed with improved accuracy and in a more appropriate manner.

In this embodiment, the head 102 includes a single flattening roller 206. In this case, the flattening roller 206 is disposed between one UV light source 204 and the array of ink-jet heads. The one UV light source 204 is disposed at one end of the head 102. Also in this case, the main scanning driver 106 causes the head 102 to perform the main scanning operation at least when the head 102 is oriented with the flattening roller 206 behind the array of ink-jet heads (when the head 102 is oriented toward one side in the main scanning direction). In the main scanning operation with the head 102 in this orientation, the flattening roller 206 flattens the layers of ink. In another possible embodiment, the main scanning driver 106 may cause the head 102 to perform the main scanning operation bidirectionally. In this case, the flattening roller 206 flattens the layers of ink only in the main scanning operation toward one side in the main scanning direction.

This embodiment enables the object 50 to be formed in a more appropriate manner by additive manufacturing using the forming apparatus 100. Next, data processing and associated operations performed at the host PC 200 will be described in more detail. The operations described below are performed when the object 50 colored on the outer surface as illustrated in FIG. 1B is formed.

Figure 3A:
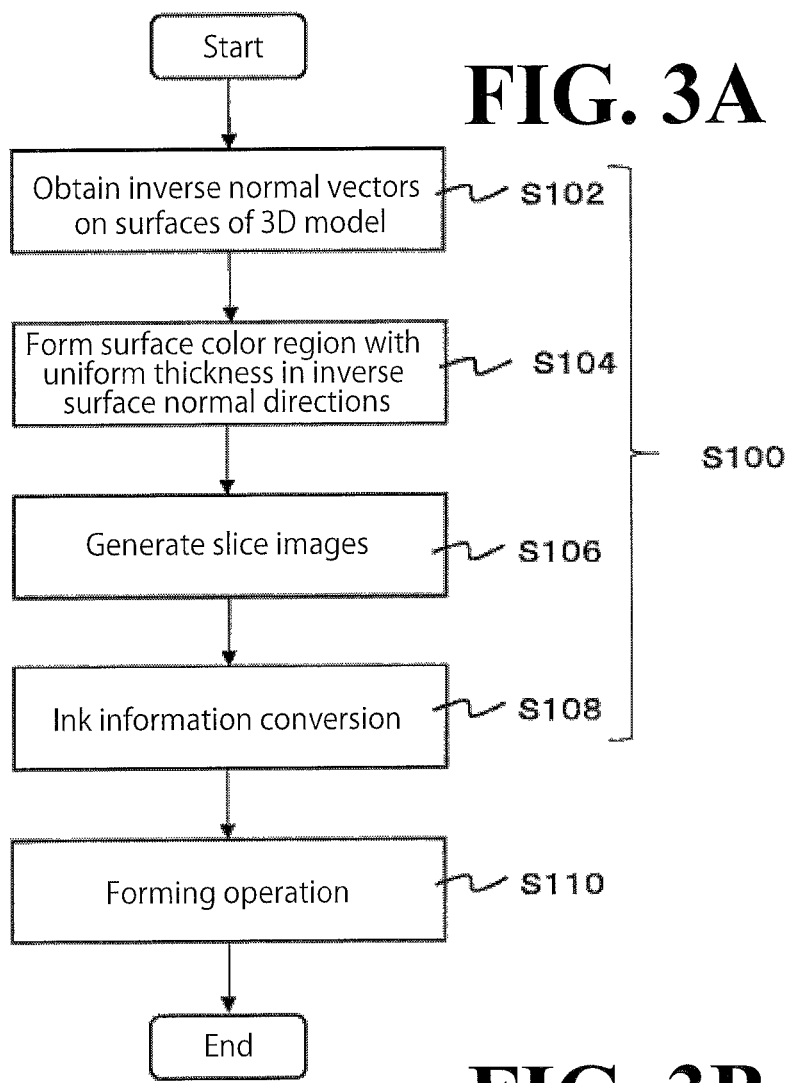
FIG. 3A is a flowchart of operations of the forming system 10.
Figure 3B:
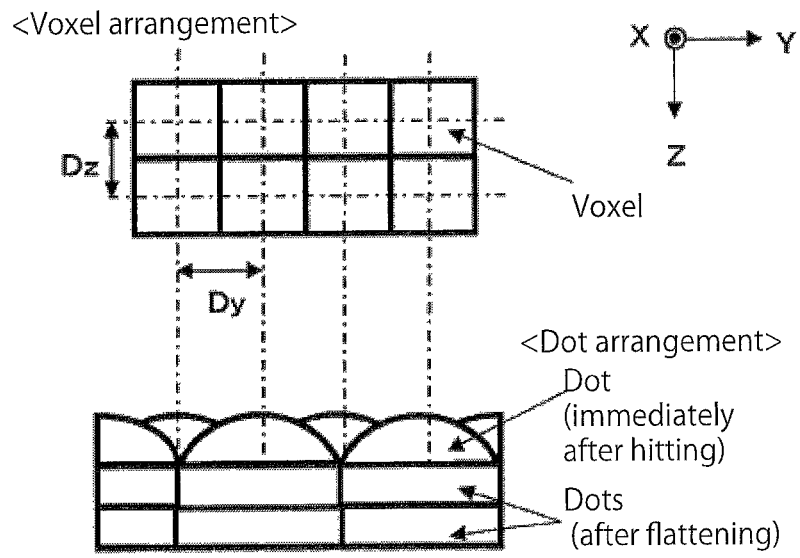
FIG. 3B schematically illustrates how ink dots are formed by the forming apparatus 100.

FIGS. 3A, 3B, 4A, 4B, 4C, and 4D illustrate exemplary operations of the forming system 10 (see FIG. 1B) including exemplary data processing performed at the host PC 200 and the forming operation performed at the forming apparatus 100. FIG. 3A is a flowchart of operations of the forming system 10. FIG. 3B schematically illustrates how ink dots are formed by the forming apparatus 100. FIGS. 4A to 4D schematically illustrate the operations described in the flowchart illustrated in FIG. 3A.

The operations described below are exemplary operations for forming the object 50 (see FIG. 1B) based on 3D model data prepared by a user. The model data represents the object 50 to be formed. As used herein, the 3D model data refers to three-dimensional data representing a three-dimensional object. A non-limiting example of the model data is general-purpose three-dimensional data independent of the type of the forming apparatus 100.

FIGS. 4A to 4D illustrate cross-sections of a 3D model obtained by predetermined processings to the model data. Each cross-section corresponds to the timing of each operation specified in the flowchart. The object 50 illustrated in FIGS. 4A to 4D is different in shape from the object 50 illustrated in FIG. 1B. More specifically, for ease of illustration, part of the upper surface of the object 50 omitted and part of the lower surface and the side surfaces of the object 50 is included in the cross-sections. As used herein, the upper surface and the lower surface of the object 50 respectively refer to the upper surface and the lower surface of the object 50 in the deposition direction. Also as used herein, the side surfaces of the object 50 refer to upright surfaces of the object 50 connecting with the lower surface of the object 50.

Also for ease of illustration, the 3D model illustrated in FIGS. 4A to 4D represents an object 50 without the inner clear region 56 and the surface clear region 60 (see FIG. 1B), that is, an object 50 with the inner region 52, the light-reflecting region 54, and the colored region 58 (see FIG. 1B). As illustrated in FIGS. 4A to 4D, the 3D model includes a colored region 302, a light-reflecting region 304, and an inner region 306. The colored region 302, the light-reflecting region 304, and the inner region 306 respectively correspond to the colored region 58, the light-reflecting region 54, and the inner region 52 of the object 50 to be formed. It is noted, however, that the colored region 302 has a pattern or other design feature at least on a portion of the outer surface of the object 50. The pattern or other design feature is different in color from other portions of the outer surface of the object 50.

The operations specified in the flowchart will be described below. In this embodiment, the forming system 10 first causes the host PC 200 to generate slice data (slice plane data) based on model data (S100). Step S100 is a non-limiting example of the cross-section data generating step of generating a plurality of pieces of cross-section data respectively representing cross-sections of the object to be formed.

Figure 4A:
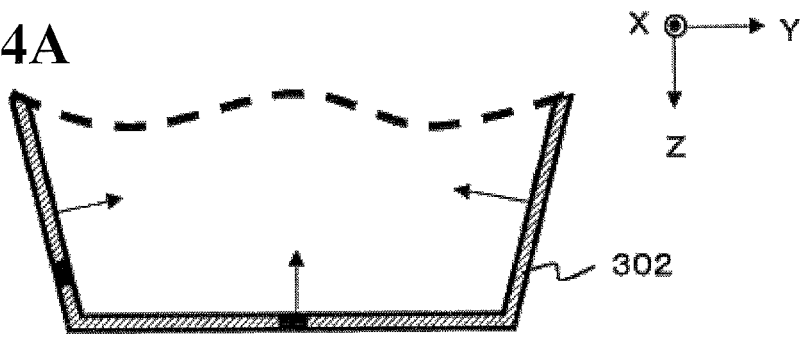
FIGS. 4A to 4D schematically illustrate the operations described in the flowchart illustrated in FIG. 3A.

At step 100, the host PC 200 first calculates normal vectors at positions on the surface of the object 50 to be formed. More specifically, as illustrated in FIG. 4A, the host PC 200 obtains inverse normal vectors at positions on the surface of the 3D model represented in the 3D model data, which is used as model data (S102).

As used herein, the surface of the 3D model refers to the outer surface of the 3D model. Also as used herein, obtaining inverse normal vectors at positions on the surface of the 3D model refers to obtaining such inverse normal vectors at positions on the outer surface of the 3D model that are approximately orthogonal to the surface of the 3D model. Also as used herein, the inverse normal vectors refer to vectors approximately orthogonal to the outer surface of the 3D model and oriented toward the inside of the 3D model (thus, inverse plane normal vectors), as indicated by the arrows in FIG. 4A.

Figure 4B:
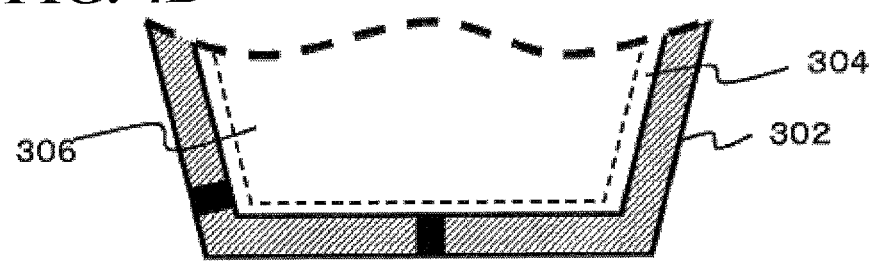

Next, the host PC 200 adjusts the thickness (width) of the colored region 302 based on the obtained inverse normal vectors. More specifically, as illustrated in FIG. 4B, the host PC 200 adjusts the thickness of the colored region 302 to make the thickness uniform throughout the positions on the colored region 302 in inverse surface normal directions, which are directions of the inverse normal vectors. As a result, the colored region 302 is formed (S104). The colored region 302 is a surface color region that is uniform in thickness in the inverse surface normal directions.

In this embodiment, step S104 is a non-limiting example of the first intermediate data generating step recited in the appended claims. The first intermediate data generating step is a step of generating first intermediate data based on the model data. The first intermediate data represents the object 50 colored over a predetermined thickness region of the object 50. The predetermined thickness region is disposed under the surface of the object 50 in normal directions of the object 50. Also in this embodiment, in the operation at step S104, the host PC 200 sets, in the 3D model, the light-reflecting region 304 and the inner region 306, which respectively correspond to the light-reflecting region 54 and the inner region 52 of the object 50 to be formed. Thus, the 3D model has all regions corresponding to the elements of the object 50 to be formed.

The thickness of the colored region 302 in each normal direction of the 3D model is preferably set to result in approximately 300 µm thickness of the colored region 58 of the object 50 (for example, from 100 µm to 500 µm). This configuration prevents the color(s) under the surface of the object 50 from being exposed even if there is a cut or other damage on the surface of the object 50 or even if there is an error in the hitting positions of ink droplets after much of the colored region 58 has been formed. The thickness of the light-reflecting region 304 in each normal direction of the 3D model is preferably set to result in equivalent to or more than 100 µm thickness of the light-reflecting region 54 of the object 50. This configuration enables the light-reflecting region 54 to more appropriately reflect external light incident through the colored region 58 and other elements.

Figure 4C:
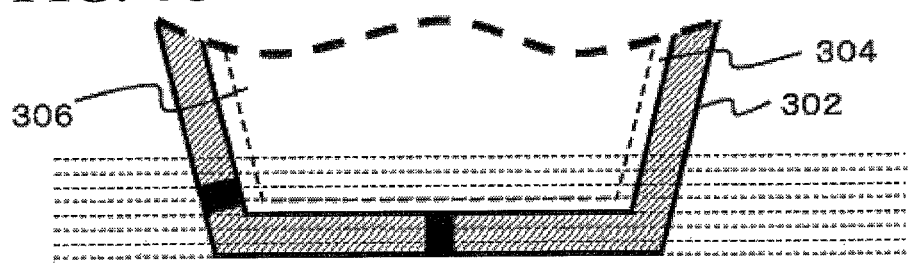
Figure 4D:
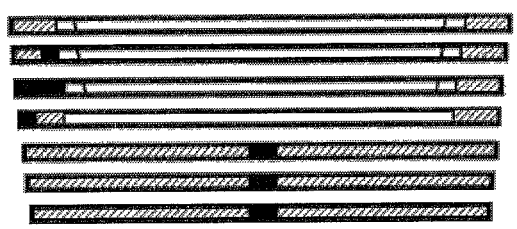

After the colored region 302 has been formed to a uniform thickness and the light-reflecting region 304 has been formed to a uniform thickness, the host PC 200 generates slice images using the resulting 3D model (S106). As used herein, generating slice images refers to generating slice data representing round slices of the D model data obtained by round slicing the D model data at uniform thicknesses. Also as used herein, the slice images refers to images of layers of ink generated based on the slice data. More specifically, in the operation at S106, the thickness of each slice of the 3D model corresponds to the thickness of each layer of ink (deposition height of ink) formed by the forming apparatus 100 as illustrated in FIG. 4C. As a result, the slice data (slice images) illustrated in FIG. 4D is generated. In the operation at step S106, the host PC 200 generates, based on the model data, a plurality of pieces of slice data each representing a cross-section of the model data that is different in position in the cross-section arrangement direction.

The host PC 200 generates a plurality of pieces of slice data each having a thickness set in advance based on specifications and/or other requirements of the forming apparatus 100. A non-limiting example of the thickness (of one slice) that the forming apparatus 100 forms based on one piece of slice data is approximately 30 Mm (for example, from 20 µm to 50 µm).

In the slice data illustrated in FIG. 4D, the portions corresponding to the colored region 302 before being sliced constitute colored region data, which represents the colored region 58 of the object 50. Therefore, when an object 50 is to be colored at least on a portion of the surface of the object 50, the host PC 200 performs the above-described operations to generate slice data that includes colored region data representing at least the colored portion of the surface of the object 50. The colored region data can be considered as representing cross-sections of the colored region, which is to be colored based on the color of the surface of the object 50. Also in the slice data, the portions corresponding to the light-reflecting region 304 and the inner region 306 correspond to the light-reflecting region 54 and the inner region 52 of the object 50 to be formed.

Also in this embodiment, step S106 is a non-limiting example of the second intermediate data generating step recited in the appended claims. The second intermediate data generating step is a step of generating second intermediate data. The second intermediate data represents a plurality of cross-sections of the first intermediate data divided in a predetermined cross-section arrangement direction.

Then, the host PC 200 performs ink information conversion based on the generated pieces of slice data (S108). As used herein, the ink information conversion refers to specifying a coloring ink for the forming apparatus 100 to use for each pixel of the slice data. Also as used herein, each pixel of the slice data refers to each pixel of a slice image corresponding to each piece of the slice data More specifically, in this embodiment, at step S108, the host PC 200 uses error diffusion to convert color information of the colored region 302 of the 3D model into ink information for use in the forming apparatus 100.

In this embodiment, before the model data undergoes the above-described processing performed by the host PC 200, the model data represents the surface of the object 50 in a multi-gradation of color. At step S108, the host PC 200 uses error diffusion to reduce the multi-level gradation of the color represented in the model data so as to generate slice data that includes colored region data representing a color in a lower level of gradation than the multi-level gradation of the color represented in the model data. More specifically, at step S108, the host PC 200 performs at least error diffusion processing step. As used herein, the error diffusion processing step is a step of performing processing of reducing, using error diffusion, the multi-level gradation of the color represented in each of the plurality of pieces of slice data generated at step S106. By performing processing at least including the error diffusion processing step at step S108, the host PC 200 generates slice data with the ink information conversion done. In this embodiment, the slice data with the ink information conversion done is a non-limiting example of the cross-section data generating step of generating a plurality of pieces of cross-section data.

After step S108, the host PC 200 uses the slice data with the ink information conversion done to cause the forming apparatus 100 to perform the forming operation (deposition operation) (S110). In this embodiment, step S110 is a non-limiting example of the formation executing step recited in the appended claims. At step S110, the forming apparatus 100 extrudes build material based on the slice data received from the host PC 200 so as to form a plurality of layers of ink constituting the object 50. In this manner, the forming apparatus 100 forms the object 50. At the same time, the forming system 10 forms, using at least coloring ink, the colored region 58 of the object 50 based on the colored region data included in the slice data. More specifically, the object 50 is in full color at least on the outer surface. This can be implemented by ink-jet technology using the plurality of ink-jet heads 202c to 202k to extrude forming-purpose ink containing color inks.

Thus, in this embodiment, the slice data is generated after the data in the model data representing the color of the surface of the object 50 (color data) is expanded over a predetermined thickness region in normal directions of the outer surface of the object 50. Then, the forming apparatus 100 adds layers of ink (slice layer) corresponding to the slice data so as to produce an object 50 colored on the outer surface. In this respect, error diffusion is used at the time of the ink information conversion. This configuration ensures more appropriate representation of a wide variety of colors including half-tone variations at the time of coloring the surface of the object 50. This configuration also ensures that an object 50 colored with improved quality is formed in a more appropriate manner.

In this embodiment, the data used in the operations before and at step S106, at which slice data is generated, may be independent of the type and/or other properties of the forming apparatus 100. The data used in the operations at and after step S108, at which ink information conversion is performed, preferably has a form adapted to the type and/or other properties of the forming apparatus 100, which performs the deposition operation. In the above-described configuration, the host PC 200 performs the operation at step S100 and the forming apparatus 100 performs the operation at step S110. In a possible modification of the forming system 10, part or entirety of the operation at step S100 may be performed at the forming apparatus 100.

A state of the object 50 being formed will be described in more detail below. FIG. 3B schematically illustrates how ink dots are formed by the forming apparatus 100, as described above. The upper half of FIG. 3B schematically illustrates how voxels constituting the object 50 are aligned (arranged). As used herein, a voxel refers to a volumetric pixel that serves as a minimum unit of forming. More specifically, in this embodiment, a voxel is an ink dot formed of one ink droplet. At the time of the forming operation, the forming system 10 causes the ink-jet heads to extrude ink to the positions of voxels arranged at intervals that are based on the forming resolution. In this manner, the forming system 10 forms an ink dot at the position of each voxel.

To focus on voxels having ink dots of the same color, each voxel is formed at a position set in advance based on the forming resolution. When a voxel is formed next to another voxel, so that the voxels are formed side by side, the distance between the voxels is a dot-to-dot distance that is based on the forming resolution. For example, when the forming operation is performed at a resolution of 600 dots per inch (dpi), the dot-to-dot distance is 1/600 inches (approximately 42 μm). In this case, the shortest distance between the voxels having ink dots of the same color is 1/600 inches. That is, ink dots of the same color are aligned with a minimal gap (pitch) of 1/600 inches.

In actual situations, the forming resolution may be direction-dependent as illustrated in the lower half of FIG. 3B. More specifically, the forming resolutions in the main scanning direction (Y direction) and the sub-scanning direction (X direction) depend on the gap between the ink-jet head nozzles (nozzle pitch) and/or on the number of paths in multi-path type forming. As used herein, the number of paths in multi-path type forming refers to the number of main scanning operations performed with respect to the same position at the time of formation of one layer of ink. The forming resolution in the deposition direction depends on the thickness (flattening pitch) made in the flattening operation performed by the flattening roller 206 (see FIG. 1B). In this respect, at the time of formation of a layer of ink, the ink hitting the deposited surface of the object generally expands over the X-Y plane and diminishes in the dimension (thickness) in the deposition direction (Z direction). In light of the circumstances, the flattening pitch is preferably smaller than the dot-to-dot distances in the main scanning direction and the sub-scanning direction under normal circumstances. In this case, the forming resolution in the deposition direction differs from the forming resolutions in the main scanning direction and the sub-scanning direction.

More specifically, when the forming resolutions in the main scanning direction and the sub-scanning direction are 600 dpi, for example, the dot-to-dot distance in the main scanning direction (see Dy in FIG. 3B) and the dot-to-dot distance in the sub-scanning direction (not illustrated) are approximately 42 μm. In contrast, the flattening pitch may be approximately 30 μm, as described above. At a flattening pitch of approximately 30 μm, the forming resolution in the deposition direction is 800 dpi.

In this case, the error diffusion processing at step S108 is preferably performed with the direction dependency of the forming resolution taken into consideration. The error diffusion processing performed with the direction dependency of the forming resolution taken into consideration will be described in more detail later. At the time of formation of the colored region 58 of the object 50, ink dots of a plurality of colors are formed at the same position set based on the forming resolution and according to design considerations. In this case, a possible arrangement of the voxels of each color is as illustrated in FIG. 3B. Also in this case, the error diffusion processing may be performed on an individual-color basis.

As described in more detail later, in this embodiment, the error diffusion processing includes distributing (diffusing) an error within the same piece of slice data and to an adjacent piece of slice data. As used herein, distributing an error within the same piece of slice data refers to distributing the error to the colored region data of this slice data. In light of the above circumstances, the colored region data of the slice data preferably has a width that is at least large enough to accommodate the distributed error. More specifically, the colored region formed based on the colored region data of one piece of slice data preferably has a width in an in-plane direction that is at least large enough to accommodate an array of a plurality of voxels.

Figure 5A:
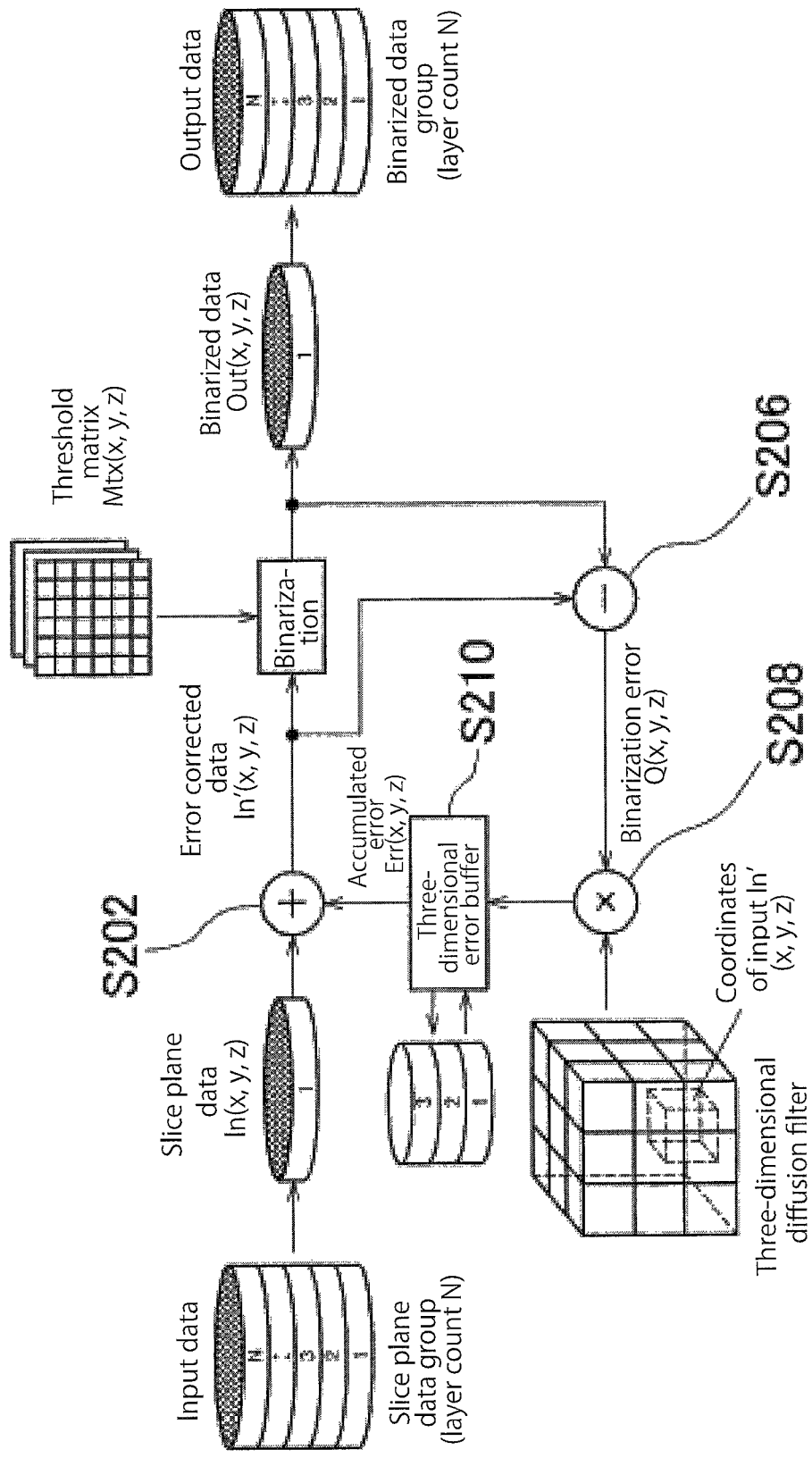
FIG. 5A is a circuit diagram schematically illustrating a configuration that performs error diffusion processing.
Figure 5B:
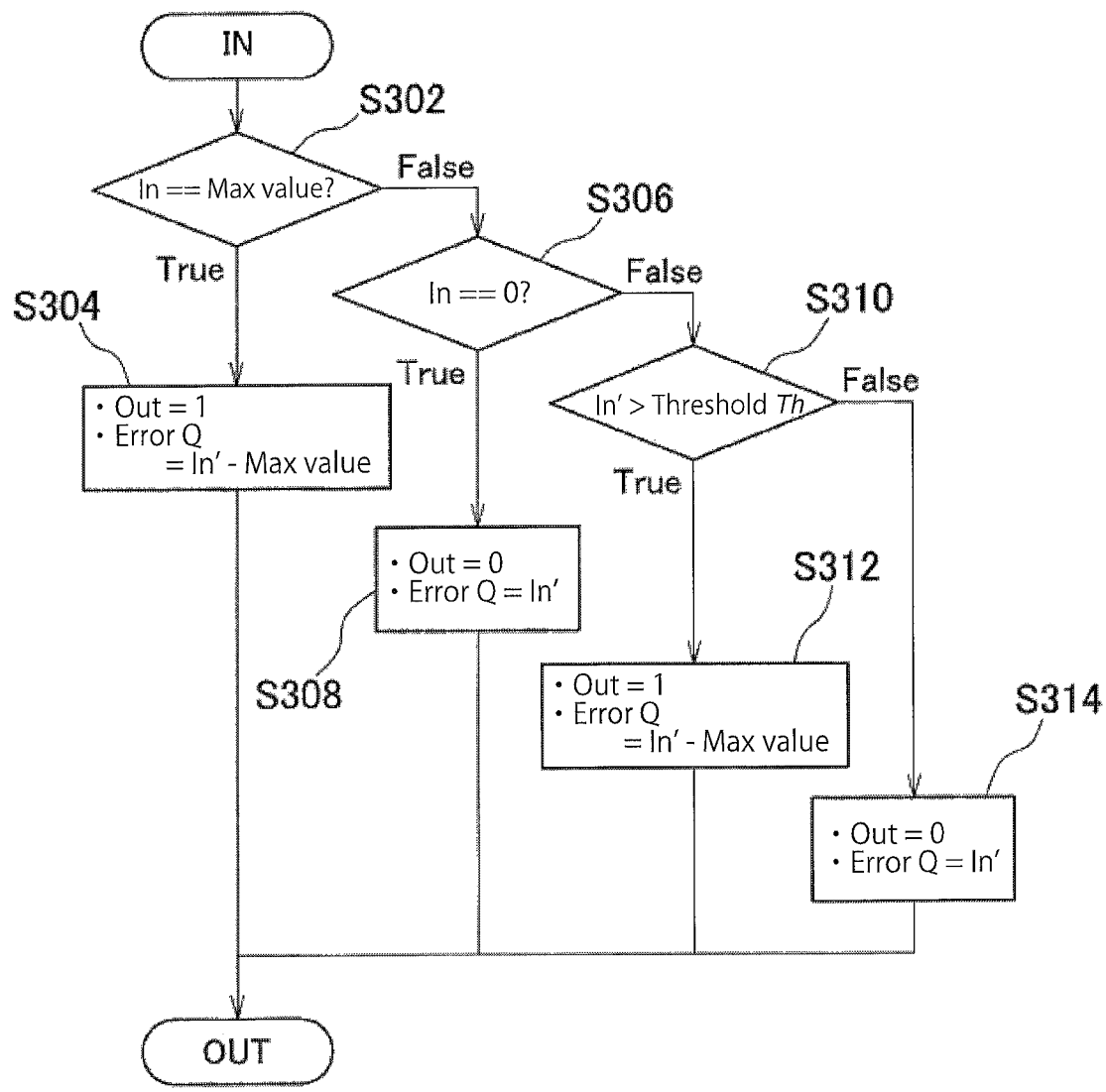
FIG. 5B illustrates binarization processing and error calculation processing of the embodiment.

The error diffusion processing will be described in more detail below. FIGS. 5A and 5B illustrate exemplary error diffusion processing performed in this embodiment. FIG. 5A is a circuit diagram schematically illustrating a configuration that performs the error diffusion processing.

As described above, in this embodiment, after the host PC 200 has generated pieces of slice data, the host PC 200 performs ink information conversion based on each of the generated pieces of slice data. The ink information conversion processing includes gradation reducing processing using error diffusion. FIG. 5A illustrates binarization processing as an example of the gradation reducing processing using error diffusion. In this case, the host PC 200 performs, for example, half-toning using error diffusion. Half-toning is processing of binarizing the color represented in a multi-level gradation in the model data. In this manner, the host PC 200 generates a plurality of pieces of slice data.

More specifically, in the error diffusion processing, a slice plane data group as illustrated in FIG. 5A is used as input data. As used herein, the slice plane data group is made up of a plurality of pieces of slice data. As described above, the plurality of pieces of slice data constituting the slice plane data group are a group of pieces of data each obtained by predetermined processing of slicing the model data representing the object into a thickness equivalent to the deposition height of ink. The slice plane data group can be considered as, for example, three-dimensional data representing the entirety of the object. In FIG. 5A, the slice plane data group is made up of N pieces of slice data, which are deposited into N layers of ink (layer count N).

In the half-toning of this embodiment, as "slice plane data" indicates in FIG. 5A, the slice data is sequentially taken out of the slice plane data group, one piece (data representing one slice) at a time, and subjected to processing. Each piece of slice data can be considered as two-dimensional data representing a planar region of one layer of ink. At this stage of processing, the colored region data of the slice data, which corresponds to the colored region of the object, represents a color in a three-level or higher multi-level gradation.

As used herein, when a color is represented in a multi-level gradation, this means that the depth of the coloring ink of each color is represented in a multi-level gradation. In this case, the color depth at each position is represented in terms of depth value, which is indicated $In(x, y, z)$ in FIG. 5A. $In(x, y, z)$ is correlated with each position on the slice data. As used herein, each position on the slice data refers to the position of each pixel of the slice data. Also as used herein, each pixel of the slice data refers to a point corresponding to each voxel of the layer of ink formed based on the slice data. Also as used herein, binarizing a color represented in a multi-level gradation refers to binarizing the depth of the color. Before half-toning is performed, the level of gradation of each color ink, which represents its depth, is preferably four or higher, more preferably eight or higher, and further more preferably 16 or higher.

In the processing with respect to the one piece of slice data taken out of the slice plane data group, error addition is performed first (S202). In this embodiment, error addition is processing of adding accumulated error $Err(x, y, z)$ to the depth value of a color correlated with each position on the slice data. As used herein, the accumulated error $Err(x, y, z)$ refers to a value of error accumulated in advance in relation to each position on the slice data. The accumulated error $Err(x, y, z)$ is stored in a three-dimensional error buffer, which accumulates error three-dimensionally.

As a result of the error addition processing, the depth value of the color correlated with each position on the slice data turns into error corrected data. As used herein, the error corrected data refers to a value of slice data corrected with an error value. Also as a result of the error addition processing, the depth value of a color correlated with each position on the slice data turns into $In'(x, y, z)$, as illustrated in FIG. 5A.

Then, the error corrected data is used to perform the binarization processing (S204) and the error calculation processing (S206). The binarization processing includes comparing the error corrected data with a threshold set in advance, so as to binarize the color depth at the position of each pixel of the slice data. More specifically, in this embodiment, the threshold is changed from among a threshold matrix of thresholds, and a threshold obtained from the threshold matrix is compared with the value of each position on the error corrected data, so that a determination is made as to which is greater, the threshold matrix or the value of each position. As illustrated in FIG. 5A, the threshold matrix is an arrangement of thresholds $Mtx(x, y, z)$ each correlated with each position on the slice data. This processing also involves binarizing the color depth corresponding to each pixel. Then, the resulting "binarized data" illustrated in FIG. 5A is used to generate binarized slice data. The binarized slice data (binarized data) can be considered as, for example, binarized data of two-dimensional data (plane data) of one piece of slice data. In the slice data, the binary depth value is correlated with each position on the slice data, as $Out(x, y, z)$ indicates in FIG. 5A. The error calculation processing includes calculating a quantization error by obtaining a difference between the error corrected data and the binarized data (binary data). In this case, the quantization error is correlated with each position on the slice data, as $Q(x, y, z)$ indicates in FIG. 5A.

After the error has been calculated, error distribution processing is performed (S208). In this embodiment, the error distribution processing includes distributing an error to an adjacent pixels using a three-dimensional diffusion filter. As used herein, the three-dimensional diffusion filter refers to a filter that distributes, in three-dimensional directions, an error resulting from binarization. More specifically, an error occurs as a result of reducing the level of color gradation, and in the error distribution processing, the host PC 200 distributes the error in the main scanning direction (Y direction), the sub-scanning direction (X direction), and the deposition direction (Z direction). This configuration ensures that three-dimensional error diffusion is performed in a more appropriate manner.

In this case, the main scanning direction and the sub-scanning direction are approximately orthogonal to each other on a surface (slice surface) approximately parallel to cross-sections of the slice data. By distributing the error in the main scanning direction and the sub-scanning direction, the host PC 200 distributes the error within the colored region of one piece of slice data. As used herein, "within the colored region of one piece of slice data" refers to the colored region of a layer of ink formed based on the one piece of slice data. Also as used herein, the deposition direction refers to a direction approximately parallel to the cross-section arrangement direction. Also as used herein, distributing the error in the deposition direction refers to distributing the error to the colored region of another piece of slice data. More specifically, in this embodiment, in half-toning of each piece of slice data, the host PC 200 distributes an error at least to an adjacent piece of slice data on one side of the cross-section arrangement direction. As used herein, distributing an error to an adjacent piece of slice data on one side of the cross-section arrangement direction refers to distributing an error from one piece of slice data being subjected to binarization processing to an adjacent piece of slice data adjacent to the one piece of slice data on one side of the cross-section arrangement direction. Also as used herein, distributing an error refers to distributing an error at the position of each pixel of the slice data to the position of a pixel. Also as used herein, a pixel of the slice data refers to a point corresponding to a voxel of the object, as described above.

In the error distribution processing of this embodiment, an error is not distributed to a binarized pixel but to an adjacent pixel that is not binarized yet. This configuration simplifies the error distribution processing. Similarly, in the error distribution in the deposition direction, an error is distributed only to pieces of slice data that are not binarized yet. In the half-toning of the pieces of slice data, the pieces of slice data may be taken out in increasing order of distance from one side of the cross-section arrangement direction. The error distribution in the deposition direction is performed only with respect to pieces of slice data on one side of the cross-section arrangement direction. In light of the circumstances, the three-dimensional diffusion filter used in this embodiment may have values set only for positions on one side of the deposition direction (for example, the positive side of the Z direction), among the positions around the position corresponding to error corrected data In'(x, y, z), which is an input of the binarization processing as illustrated in FIG. 5A. Using such three-dimensional diffusion filter ensures that an error is distributed in the directions in a simpler and more appropriate manner.

The error distributed in the error distribution processing is added to the error stored in the three-dimensional error buffer, and thus the accumulated error Err(x, y, z) is updated (S210). Similarly, an error corresponding to each position on the slice data is accumulated.

With the above-described configuration, each piece of slice data is subjected to half-toning, which is the error diffusion processing in this embodiment, in a more appropriate manner. In this half-toning, the output data is a binarized data group, which is made up of layers of binarized pieces of slice data (binarized data). This configuration ensures that a binarization result corresponding to the entirety of the object is output in a more appropriate manner. This configuration also ensures that the slice plane data group corresponding to the entirety of the object is subjected to half-toning in a more appropriate manner.

The binarization processing, performed at step S204, will be described in more detail below. FIG. 5B illustrates binarization processing and error calculation processing of the embodiment. As described above, the error diffusion processing performed in this embodiment includes comparing the error corrected data with a threshold obtained from the threshold matrix so as to obtain an output and an error. As used herein, the error refers to a difference between the error corrected data and the output.

Also in this embodiment, when the value of the input (input data) is at its maximum or minimal, the output is determined as 1 or 0, irrespective of the value of the error corrected data. As used herein, when the value of the input (input data) is at its maximum or minimal, this means that the value of the position of each pixel of the slice data is at its maximum or minimal.

More specifically, when the input (In) is equivalent to a predetermined maximum value (Max value) at a pixel (S302, True), the output (Out) corresponding to the pixel is set at 1 (S304). In this case, the error (Q) is set at a value obtained by subtracting the maximum value (Max value) from the value (In') of the error corrected data. After these values have been set, the output and the error corresponding to the pixel are set.

When the input is not equivalent to the maximum value (S302, False), additional processing of comparing the input with the minimal value (0) is performed (S306). When the input is equivalent to the minimal value (S306, True), the output corresponding to the pixel is set at 0 (S308). In this case, the error is set at the value of the error corrected data. After these values have been set, the output and the error corresponding to the pixel are set.

When the input is not equivalent to the minimal value (S306, False), additional processing of comparing the error corrected data with the threshold (Th) obtained from the threshold matrix is performed (S310). Then, when the error corrected data is greater than the threshold (Th) (S310, True), the output corresponding to the pixel is set at 1 (S312). In this case, the error is set at a value obtained by subtracting the maximum value from the value of the error corrected data. After these values have been set, the output and the error corresponding to the pixel are set.

When the error corrected data is equivalent to or less than the threshold (S310, False), the output corresponding to the pixel is set at 0 (S314). In this case, the error is set at the value of the error corrected data. After these values have been set, the output and the error corresponding to the pixel are set. This configuration ensures that the output and the error of the binarization processing are obtained in a more appropriate manner.

Figure 6:
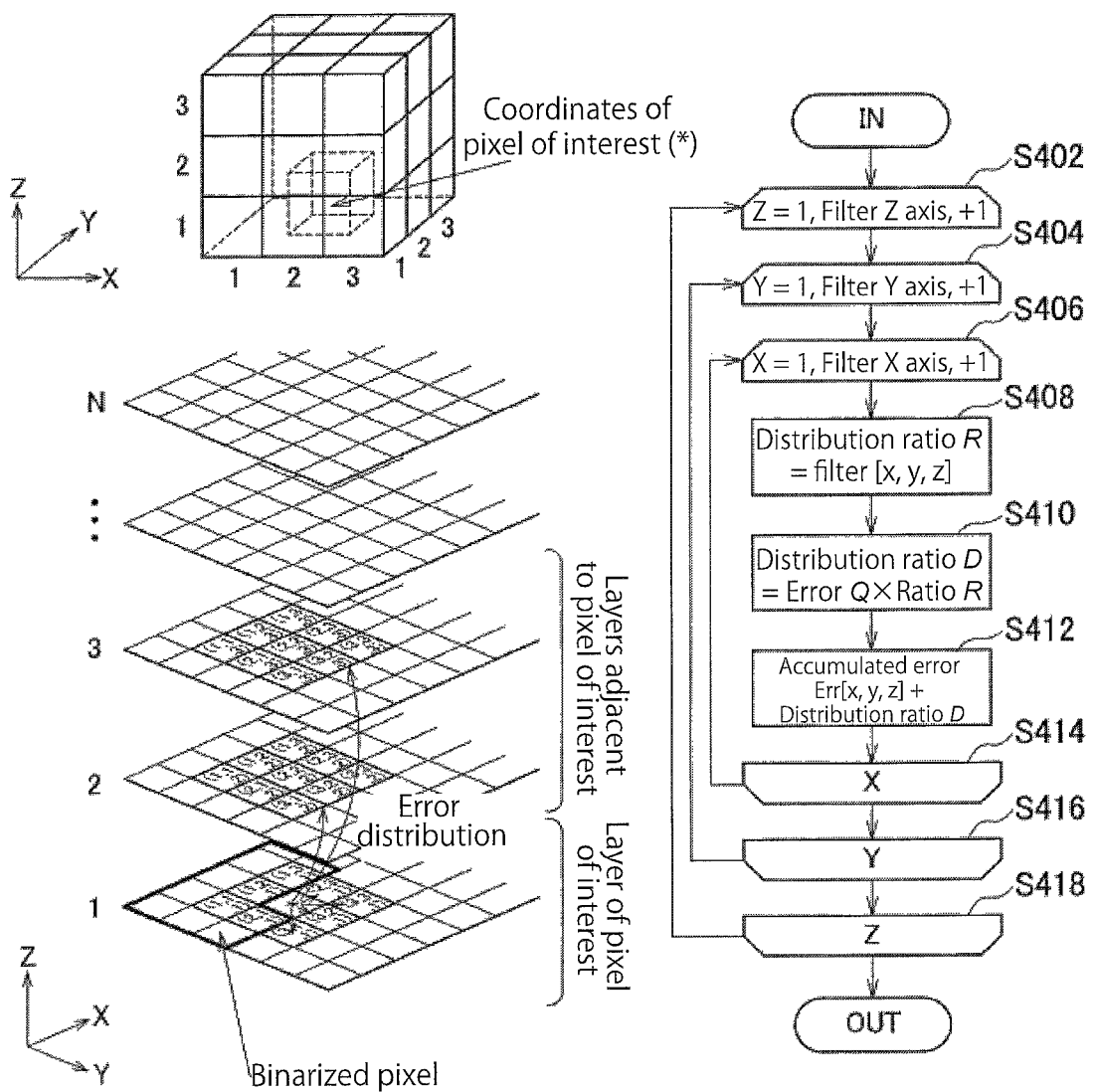
FIG. 6 illustrates error distribution processing in more detail.

The error distribution processing described above in the context of step S208 illustrated in FIG. 5A will be described in more detail below. FIG. 6 illustrates the error distribution processing in more detail. As described above, the error distribution processing performed in this embodiment is processing of distributing (diffusing) an error occurring in a pixel of interest that is being binarized to pixels around the pixel of interest. In this case, how the error is distributed is determined by the diffusion filter. The diffusion filter used in this embodiment is a three-dimensional diffusion filter. The three-dimensional diffusion filter has a three-dimensional configuration that enables an error to be distributed in the slice data including the pixel of interest (layer including the pixel of interest) and distributed to adjacent slice data (adjacent layers). Thus, as determined by the three-dimensional diffusion filter, an error is distributed from the pixel of interest to adjacent pixels. The error value distributed to each of the adjacent pixels is determined by a distribution ratio specified in the diffusion filter. In the error distribution, the error is not distributed to an already binarized pixel.

More specifically, as illustrated in the left half of FIG. 6, an error is distributed in the main scanning direction, the sub-scanning direction, and the deposition direction (distributed in the XYZ directions) using a three-dimensional diffusion filter that has a 3×3×3 configuration, that is, a distribution ratio for three pixels in each of the three directions is set. In the illustrated example, the position of the pixel of interest is (2, 2, 1).

In this error distribution, as illustrated in the flowchart in the right half of FIG. 6, the values of X, Y, and Z are set at 1, which is initial value (S402, S404, and S406). Then, the value of the three-dimensional diffusion filter corresponding to the initial position is set as the distribution ratio (filter [x, y, z]) (S408). Then, a distributed error D, which is an error distributed to the initial position, is set at the product of an error value Q and a distribution ratio R (S410). Then, the distributed error D is added to an accumulated error Err[x, y, z] corresponding to the initial position, so that the accumulated error is updated (S412). The processings at steps S408, S410, and S412 are repeated with the value of X increased one at a time until the value of X becomes its maximum in the X axis direction of the three-dimensional diffusion filter (S406, S414).

After the value of X has reached its maximum, the procedure returns to step S404 from step S414, and the loop of steps S406 to S414 is repeated with the value of Y increased one at a time until the value of Y becomes its maximum in the Y axis direction of the three-dimensional diffusion filter (S404, S416). After the value of Y has reached its maximum, the procedure returns to step S402 from step S416, and the loop of steps S404 to S416 is repeated with the value of Z increased one at a time until the value of Z becomes its maximum in the Z axis direction of the three-dimensional diffusion filter (S402. S418). When the value of X reaches its maximum, the procedure leaves the loop. Thus, error distribution for one pixel of interest ends. This configuration ensures that error distribution in the main scanning direction, the sub-scanning direction, and the deposition direction is performed in a more appropriate manner.

Some of the various advantageous effects of this embodiment will be described below with additional notes and modifications. As described above, when the forming resolution of the object 50 is direction dependent, the error diffusion processing is preferably performed with the direction dependency of the forming resolution taken into consideration. In this case, the error distribution ratio in each of the main scanning direction, the sub-scanning direction, and the deposition direction may be set based on the forming resolution in each direction.

The direction dependency of the forming resolution is as described above by referring to FIG. 3B and other drawings. Specifically, the forming resolution in the deposition direction may be different from the forming resolutions in the main scanning direction and the sub-scanning direction. In this case, the error distribution ratio in the deposition direction is preferably different from the error distribution ratios in the main scanning direction and the sub-scanning direction.

In this case, the number of voxels arranged in the range over which an error is distributed may vary according to the forming resolution in each direction. As used herein, the voxels arranged in the range over which the error is distributed refers to adjacent pixels to which the error is distributed from a pixel of interest of the slice data. More specifically, the number of the voxels arranged in the range over which the error is distributed in the deposition direction may be different from the number of the voxels arranged in the range over which the error is distributed in the main scanning direction and the sub-scanning direction.

When the number of voxels arranged in the range over which the error is distributed varies depending on the forming resolution in each direction, it is preferable to make uniform the distance of the range over which the error is distributed in the main scanning direction, the sub-scanning direction, and the deposition direction. In this case, the range made up of the voxel corresponding to a pixel of interest, which is target of binarization, and the voxels corresponding to the pixels to which the error resulting from the binarization is distributed is in the form of a cubic region that have equal sides in directions parallel to the main scanning direction, the sub-scanning direction, and the deposition direction.

As used herein, when the distance of the range is uniform, this means that the distance of the range is approximately uniform with a degree of accuracy based on the forming resolution. Also as used herein, when the distance of the range is uniform, this means that the difference between the distances over which the error is distributed in the directions is less than the minimal gap (pitch) of the forming resolution. Also as used herein, when the distance of the range is uniform, this may mean that the number of voxels arranged in the range over which the error is distributed in each direction is set with a minimal difference between the distances of the range over which the error is distributed in the directions.

As used herein, a voxel refers to a volumetric pixel that serves as a minimum unit of forming, as described above. A voxel can also be considered as a unit of data of an ink droplet. A voxel can also be considered as a unit of arrangement with the minimal gap (pitch) of the forming resolution in each of the main scanning direction, the sub-scanning direction, and the deposition direction.

The arrangement of voxels at the time of has been described with a main focus on in agreement with positions determined from design considerations. In actual situations, however, ink dots corresponding to voxels may not necessarily be formed at in agreement with positions determined from design considerations in a strict sense. Instead, ink dots corresponding to voxels may be formed in agreement with positions determined from design considerations, depending on accuracy requirements of the formation operation. As used herein, when ink dots are formed in agreement with positions determined from design considerations, this means that the timing at which ink droplets are extruded from the ink-jet heads agree with the positions of the voxels determined from design considerations. More specifically, when an object is formed using ink-jet heads, an ink droplet hitting the deposited surface of the object expands in in-plane directions after the ink droplet is deposited on the surface. Specifically, the ink dot expands to an estimated diameter of approximately 100 μm. In this case, when the forming resolution is 600 dpi, for example, the diameter of the ink dot is approximately 2.5 times the dot gap (approximately 42 μm) of the forming resolution. Even in this case, setting the timing at which to extrude ink droplets in agreement with the positions of the voxels determined from design considerations ensures that ink dots corresponding to the voxels are formed in a more appropriate manner in agreement with positions determined from design considerations.

As described above, in this embodiment, binarization processing using error diffusion is performed with respect to a color represented in a multi-level gradation in the model data. This configuration ensures that in the process of forming an object, a coloring ink of a predetermined color is represented in half-tone colors. The coloring ink is a non-limiting example of the color component of the material of the colored portion of the object.

The binarization processing using error diffusion can be considered as a non-limiting example of the quantization processing of reducing the level of color gradation. In a modification of the forming system 10, another kind of quantization processing may be performed, instead of binarization. In this case, using error diffusion, similarly to the binarization configuration, enables the level of color gradation to be reduced in a more appropriate manner.

The error diffusion processing will not be limited to the above-described configuration but may be implemented in any of various other forms. Specifically, the error diffusion processing has been mainly described as using a threshold matrix by referring to FIGS. 5A and 5B and other drawings. The quantization processing such as binarization, however, may not necessarily use a threshold matrix but may involve comparing error corrected data with a threshold. In this case, the threshold may be a constant value set in advance.

The embodiment of the present disclosure finds applications in, but not limited to, methods for forming objects.

10 . . . forming system, 50 . . . object, 52 . . . inner region, 54 . . . light-reflecting region, 56 . . . inner clear region. 58 . . . colored region, 60 . . . surface clear region, 70 . . . support layer, 100 . . . forming apparatus, 102 . . . head portion, 104 . . . platform, 106 . . . main scanning driver, 108 . . . sub-scanning driver, 110 . . . deposition direction driver, 120 . . . controller, 200 . . . host computer PC, 202 . . . ink-jet head, 204 . . . UV light source, 206 . . . flattening roller, 302 . . . colored region, 304 . . . light-reflecting region, 306 . . . inner region

What is claimed is:

1. A forming method for forming a three-dimensional object, the method comprising:
   a cross-section data generating step of, based on model data representing the object to be formed, generating a plurality of pieces of cross-section data respectively representing cross-sections of the object to be formed that are different from each other in position in a predetermined cross-section arrangement direction in which the cross-sections are arranged; and
   a formation executing step of discharging build materials respectively based on the plurality of pieces of cross-section data so as to form the object,
   wherein the object is formed such that at least a part of each of the cross-sections of the object includes a colored region,
      the plurality of pieces of cross-section data generated in the cross-section data generating step comprise a plurality of pieces of colored region data respectively representing cross-sections of the colored region of the object that is to be colored based on a color of a surface of the object, each of the cross-sections of the colored region corresponding to the colored portion at least on a surface of each of the cross-sections of the colored region,
      the formation executing step comprises forming the colored region using the build materials based on the colored region data, the build materials each comprising a coloring build material,
      the model data represents the color of the surface of the object in a multi-level gradation,
      each of the plurality of pieces of colored region data generated in the cross-section data generating step represents a color in a lower level of gradation than the multi-level gradation of the color of the surface of the object represented in the model data, the lower level of gradation being obtained by reducing the multi-level gradation using error diffusion, and
      the colored region is a region having a predetermined thickness under the surface and is adjusted in the cross-section data generating step to make the predetermined thickness uniform in a normal direction of the object approximately perpendicular to the surface of the object.

2. The forming method according to claim 1, wherein the cross-section data generating step comprises
   a first intermediate data generating step of generating, based on the model data, first intermediate data representing the object including the colored region,
   a second intermediate data generating step of generating second intermediate data by dividing the object represented in the first intermediate data into a plurality of cross-sections in the cross-section arrangement direction, and
   an error diffusion processing step of reducing, using error diffusion, levels of color gradation of the plurality of cross-sections in the second intermediate data so as to generate the plurality of pieces of cross-section data.

3. The forming method according to claim 1, wherein the cross-section data generating step comprises distributing an error to be distributed in the error diffusion at least to a first portion of the colored region and a second portion of the colored region, the first portion corresponding to one piece of cross-section data among the plurality of pieces of cross-section data, the second portion corresponding to another piece of cross-section data that is among the plurality of pieces of cross-section data and that abuts the one piece of cross-section data in the cross-section arrangement direction.

4. The forming method according to claim 1,
   wherein so as to form the object, the formation executing step comprises
      causing an extrusion head that extrudes the build materials to perform a main scanning operation that comprises moving in a predetermined main scanning direction while discharging the build materials, and
      causing the extrusion head to perform deposition direction scanning that comprises moving relative to the object while the object is being formed in a deposition direction in which the build materials are deposited, and
   wherein the cross-section data generating step comprises distributing an error to be distributed in error diffusion in the main scanning direction, in a sub-scanning direction approximately orthogonal to the main scanning direction, and in the deposition direction.

5. The forming method according to claim 4, wherein the cross-section data generating step comprises
   distributing the error in the main scanning direction according to a first distribution ratio of the error, the first distribution ratio being set based on a first forming resolution in the main scanning direction,
   distributing the error in the sub-scanning direction according to a second distribution ratio of the error, the second distribution ratio being set based on a second forming resolution in the sub-scanning direction, and distributing the error in the deposition direction according to a third distribution ratio of the error, the third distribution ratio being set based on a third forming resolution in the deposition direction.

6. The forming method according to claim 4, wherein the cross-section data generating step comprises causing the third distribution ratio of the error in the deposition direction to be different from the first distribution ratio of the error in the main scanning direction and the second distribution ratio of the error in the sub-scanning direction.

7. The forming method according to claim 4,
wherein the formation executing step comprises causing the extrusion head to extrude the build materials to respective positions of voxels arranged at intervals that are based on a forming resolution, and
wherein the cross-section data generating step comprises
when the levels of gradation are reduced in the error diffusion and the error occurs at a position of each of the voxels, distributing the error to a position of another voxel adjacent to the each of the voxels, and
causing a number of the voxels arranged in a range over which the error is distributed in the deposition direction to be different from the number of the voxels arranged in a range over which the error is distributed in the main scanning direction and different from the number of the voxels arranged in a range over which the error is distributed in the sub-scanning direction.

8. The forming method according to claim 4, wherein the cross-section data generating step comprises causing a distance of a range over which the error is distributed in the error diffusion to be uniform among the main scanning direction, the sub-scanning direction, and the deposition direction.

9. The forming method according to claim 1, wherein the cross-section data generating step comprises performing error diffusion to half-tone the color represented in the multi-level gradation in the model data into a binary gradation so as to generate the plurality of pieces of cross-sections data.

10. The forming method according to claim 1, wherein after the multi-level gradation of the color represented in the model data has been reduced using error diffusion, the formation executing step comprises representing a half-tone color using the build material of the colored portion of the object.

11. The forming method according to claim 1, wherein the formation executing step comprises forming the colored object using a plurality of extrusion heads configured to extrude build materials of colors different from each other.

12. The forming method according to claim 1, wherein the build materials each comprise an ultraviolet curable ink that is curable under ultraviolet light.

13. The forming method according to claim 1, wherein the formation executing step comprises flattening layers of the build materials using a flattener so as to adjust a thickness of each of the layers to a predetermined thickness, the layers being respectively formed based on the plurality of pieces of cross-section data.

14. A forming system configured to form a three-dimensional object, the forming system comprising:
a cross-section data generator configured to, based on model data representing the object to be formed, generate a plurality of pieces of cross-section data respectively representing cross-sections of the object to be formed that are different from each other in position in a predetermined cross-section arrangement direction in which the cross-sections are arranged; and
a formation executor configured to extrude build materials respectively based on the plurality of pieces of cross-section data so as to form the object,
wherein the object is formed such that at least a part of each of the cross-sections of the object includes a colored region,
the plurality of pieces of cross-section data generated by the cross-section data generator comprise a plurality of pieces of colored region data respectively representing cross-sections of the colored region of the object that is to be colored based on a color of a surface of the object, each of the cross-sections of the colored region corresponding to the colored portion at least on a surface of each of the cross-sections of the colored region,
the formation executor comprises forming the colored region using the build materials based on the colored region data, the build materials each comprising a coloring build material,
the model data represents the color of the surface of the object in a multi-level gradation,
each of the plurality of pieces of colored region data generated by the cross-section data generator represents a color in a lower level of gradation than the multi-level gradation of the color of the surface of the object represented in the model data, the lower level of gradation being obtained by reducing the multi-level gradation using error diffusion, and
the colored region is a region having a predetermined thickness under the surface and is adjusted in the cross-section data generator to make the predetermined thickness uniform in a normal direction of the object approximately perpendicular to the surface of the object.

15. A forming apparatus configured to form a three-dimensional object by discharging build materials respectively based on a plurality of pieces of cross-section data received from a cross-section data generator, the plurality of pieces of cross-section data respectively representing cross-sections of the object to be formed that are different from each other in position in a predetermined cross-section arrangement direction in which the cross-sections are arranged,
wherein the cross-section data generator is configured to generate the plurality of pieces of cross-section data based on model data representing the object to be formed, and
wherein the object is formed such that at least a part of each of the cross-sections of the object includes a colored region,
the plurality of pieces of cross-section data received from the cross-section data generator comprise a plurality of pieces of colored region data respectively representing cross-sections of the colored region of the object that is to be colored based on a color of a surface of the object, each of the cross-sections of the colored region corresponding to the colored portion at least on a surface of each of the cross-sections of the colored region,
the forming apparatus is configured to form the colored region using the build materials based on the colored region data, the build materials each comprising a coloring build material,
the model data represents the color of the surface of the object in a multi-level gradation,
each of the plurality of pieces of colored region data generated by the cross-section data generator represents a color in a lower level of gradation than the multi-level gradation of the color of the surface of the object represented in the model data, the lower level of gradation being obtained by reducing the multi-level gradation using error diffusion, and the colored region is a region having a predetermined thickness under the surface and is adjusted in the cross-section data generator to make the predetermined thickness uniform in a normal direction of the object approximately perpendicular to the surface of the object.

16. The forming method according to claim 2, wherein the cross-section data generating step comprises distributing an error to be distributed in the error diffusion at least to a first portion of the colored region and a second portion of the colored region, the first portion corresponding to one piece of cross-section data among the plurality of pieces of cross-section data, the second portion corresponding to another piece of cross-section data that is among the plurality of pieces of cross-section data and that abuts the one piece of cross-section data in the cross-section arrangement direction.

17. The forming method according to claim 2,
wherein so as to form the object, the formation executing step comprises
causing an extrusion head that extrudes the build materials to perform a main scanning operation that comprises moving in a predetermined main scanning direction while discharging the build materials, and
causing the extrusion head to perform deposition direction scanning that comprises moving relative to the object while the object is being formed in a deposition direction in which the build materials are deposited, and
wherein the cross-section data generating step comprises distributing an error to be distributed in error diffusion in the main scanning direction, in a sub-scanning direction approximately orthogonal to the main scanning direction, and in the deposition direction.

18. The forming method according to claim 3,
wherein so as to form the object, the formation executing step comprises
causing an extrusion head that extrudes the build materials to perform a main scanning operation that comprises moving in a predetermined main scanning direction while discharging the build materials, and
causing the extrusion head to perform deposition direction scanning that comprises moving relative to the object while the object is being formed in a deposition direction in which the build materials are deposited, and
wherein the cross-section data generating step comprises distributing an error to be distributed in error diffusion in the main scanning direction, in a sub-scanning direction approximately orthogonal to the main scanning direction, and in the deposition direction.

19. The forming method according to claim 16,
wherein so as to form the object, the formation executing step comprises
causing an extrusion head that extrudes the build materials to perform a main scanning operation that comprises moving in a predetermined main scanning direction while discharging the build materials, and
causing the extrusion head to perform deposition direction scanning that comprises moving relative to the object while the object is being formed in a deposition direction in which the build materials are deposited, and
wherein the cross-section data generating step comprises distributing an error to be distributed in error diffusion in the main scanning direction, in a sub-scanning direction approximately orthogonal to the main scanning direction, and in the deposition direction.

20. The forming method according to claim 17, wherein the cross-section data generating step comprises
distributing the error in the main scanning direction according to a first distribution ratio of the error, the first distribution ratio being set based on a first forming resolution in the main scanning direction,
distributing the error in the sub-scanning direction according to a second distribution ratio of the error, the second distribution ratio being set based on a second forming resolution in the sub-scanning direction, and
distributing the error in the deposition direction according to a third distribution ratio of the error, the third distribution ratio being set based on a third forming resolution in the deposition direction.

* * * * *